(12) United States Patent
You

(10) Patent No.: US 7,364,821 B2
(45) Date of Patent: Apr. 29, 2008

(54) LASER MASK AND METHOD OF CRYSTALLIZATION USING THE SAME

(75) Inventor: JaeSung You, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 365 days.

(21) Appl. No.: 11/103,632

(22) Filed: Apr. 12, 2005

(65) Prior Publication Data

US 2005/0233511 A1 Oct. 20, 2005

(30) Foreign Application Priority Data

Apr. 14, 2004 (KR) .................... 10-2004-0025900

(51) Int. Cl.
G03F 1/00 (2006.01)
(52) U.S. Cl. ........................................ 430/5
(58) Field of Classification Search .......... 430/5, 430/394; 438/166; 117/43; 716/19, 21
See application file for complete search history.

(56) References Cited

FOREIGN PATENT DOCUMENTS

| JP | 2002-324759 | 11/2002 |
|---|---|---|
| JP | 2003-282441 | 10/2003 |

*Primary Examiner*—S. Rosasco
(74) *Attorney, Agent, or Firm*—McKenna Long & Aldridge, LLP (57) ABSTRACT

Provided is a method for crystallizing using a laser mask for selectively crystallizing active regions without a laser shot mark, including: providing an array substrate in which N×M active regions are defined; positioning a laser mask having first and second blocks over the substrate, wherein the first and second blocks have first and second mask patterns, respectively, and the second mask pattern is a reverse pattern of the first mask pattern; irradiating a first laser beam onto the active regions through the first block; and irradiating a second laser beam onto the active regions through the second block.

6 Claims, 10 Drawing Sheets

LASER MASK AND METHOD OF CRYSTALLIZATION USING THE SAME

This application claims the benefit of Korean Patent Application No. 2004-25900, filed on Apr. 14, 2004, which is hereby incorporated by reference for all purposes as if fully set forth in its entirety herein.

BACKGROUND OF THE INVENTION

1. Field of the Invention

The present invention relates to a laser mask and method of crystallization using the same, and particularly, to a laser mask and method of crystallization using the same which crystallizes active regions of thin film transistors without a shot mark.

2. Discussion of the Related Art

Recently, as information displays, especially portable information displays, have drawn great attention, thin and lightweight flat panel display (FPD) devices which can replace existing Cathode Ray Tubes (CRTs) have been actively researched and commercialized. Particularly, of these FPD devices, liquid crystal display (LCD) devices, as a device for displaying images by using optical anisotropic properties of liquid crystal, are widely used for notebook computers or desktop monitors due to their superior resolution, color rendering capability, image quality or the like.

An active matrix (AM) driving method is generally used for driving the LCD devices which use an amorphous silicon thin film transistor (TFT) as a switching element in a pixel unit.

General ideas of the amorphous silicon thin film transistor technique were established by LeComber, et al. in Britain in 1979 and were commercialized as a three-inch liquid crystal portable television in 1986. Recently, a large dimension TFT-LCD device with its size being more than 50 inches has been developed.

However, due to its lower electrical mobility (<1 cm$^2$/Vsec), the amorphous silicon thin film transistor has a limit on its use for peripheral circuits which require a high speed operation at greater than 1 MHz. Thus, researches for simultaneously integrating a pixel unit and a driving circuit unit on a glass substrate using a polycrystalline silicon thin film transistor which has a field effect mobility greater than that of the amorphous silicon thin film transistor have been actively carried out.

The polycrystalline silicon thin film transistor technique has been applied to a small module such as camcorders, since a liquid crystal display color television was developed in 1982. According to the polycrystalline silicon thin film transistor technique which supports low photosensitivity and high electric field effect mobility, driving circuits can be fabricated directly on a substrate.

Increased mobility can improve an operation frequency of the driving circuit unit which determines the number of pixels that can be driven, and fine minuteness of a display device can be thereby facilitated. In addition, a distortion of a transfer signal is reduced by a decrease of a charging time for a signal voltage of the pixel unit, thereby expecting an improvement of an image quality.

Furthermore, the polycrystalline silicon thin film transistor can be driven under 10V, compared with the amorphous silicon thin film transistor requiring a high driving voltage (i.e., approximately 25V), so as to advantageously reduce power consumption.

On the other side, the polycrystalline silicon thin film transistor can be fabricated by depositing a polycrystalline silicon thin film directly on a substrate or by depositing a amorphous silicon thin film on a substrate that is then crystallized by a thermal treatment. In particular, in order to use a low-cost glass substrate, low temperature processes are required, and in order to use the polycrystalline silicon thin film transistor for a device in the driving circuit unit, a method for improving a field effect mobility of the thin film transistor is required.

In general, the thermal treatment methods for crystallizing an amorphous silicon thin film include a solid phase crystallization (SPC) method and an excimer laser annealing (ELA) method.

The SPC method, for instance, forms a polycrystalline silicon thin film at a temperature of approximately 600° C. In this SPC method, after forming an amorphous silicon thin film on a glass substrate, the amorphous silicon thin film is crystallized by performing a thermal treatment for several up to tens of hours at approximately 600° C. A polycrystalline silicon thin film obtained by the SPC method generally has comparatively large-size grains of about several μm. However, the grains contain many defects therein. These defects are known to have negative influences on the capability of the thin film transistor, although not as bad as grain boundaries in the thin film transistor.

The ELA method is a typical method for fabricating a polycrystalline silicon thin film at a low temperature. In this ELA method, an amorphous silicon thin film is crystallized by instantaneously irradiating a high energy laser beam onto the amorphous silicon thin film for a time of tens of nsec (nanoseconds). In this method, the amorphous silicon thin film is melted and crystallized in a very short time, so that the glass substrate is not damaged.

Moreover, a polycrystalline silicon thin film fabricated by using the excimer laser has excellent electrical characteristics, compared to a polycrystalline silicon thin film fabricated by a general thermal treatment method. For instance, a field effect mobility of an amorphous silicon thin film transistor is about 0.1~0.2 cm$^2$/Vsec, and that of an polycrystalline silicon thin film transistor fabricated by a general thermal treatment method is about 10~20 cm$^2$/Vsec. A field effect mobility of a polycrystalline silicon thin film transistor fabricated by using the excimer laser method is more than 100 cm$^2$/Vsec.

Figure 1:
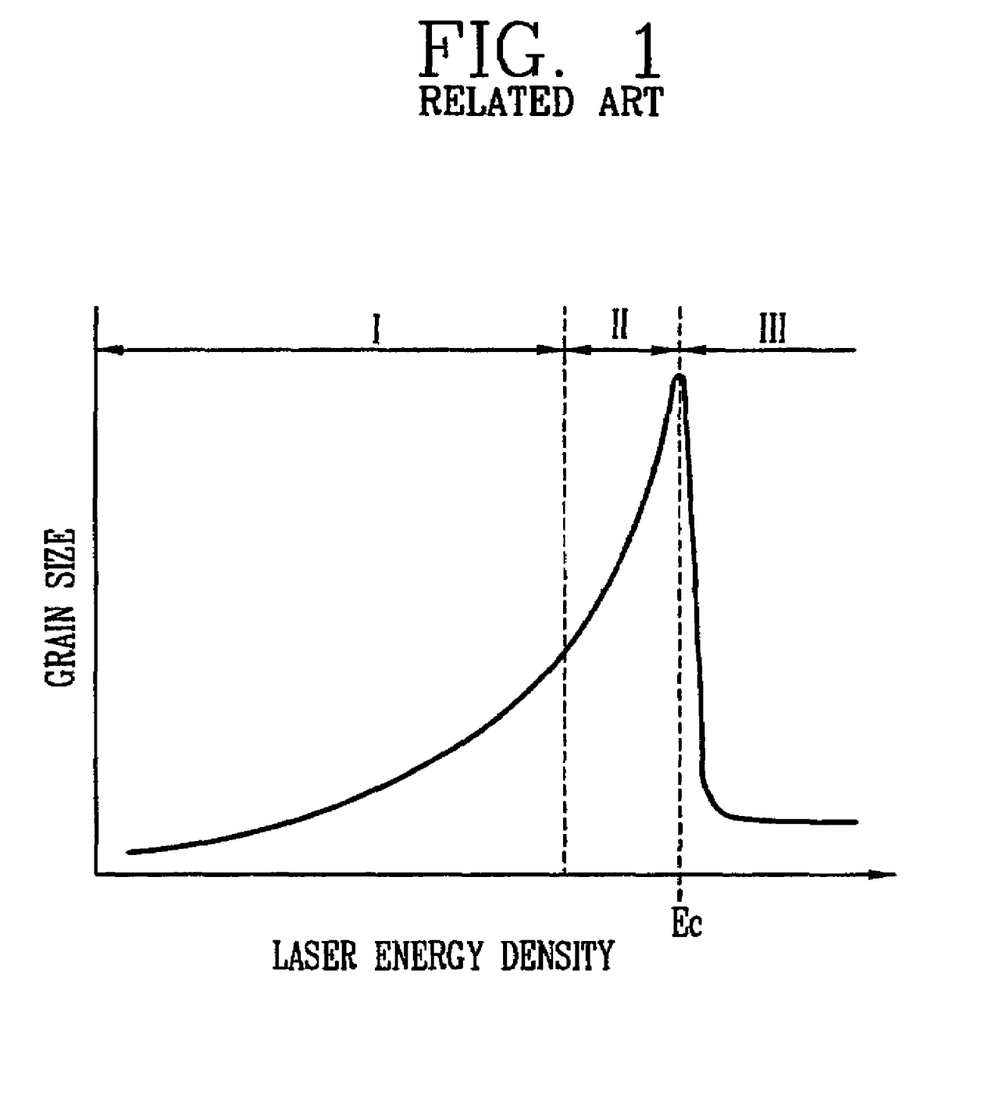
FIG. 1 is a graph showing a size of a grain of a crystallized silicon thin film with respect to an energy density of a laser applied.

A crystallization method using a laser will now be explained in detail. FIG. 1 is a graph showing a size of the grain of a crystallized silicon thin film with respect to a laser energy density used to form the crystallized silicon thin film.

Referring to FIG. 1, as the laser energy density increases, the grain size of the polycrystalline silicon thin film increases in the first region I and the second region II. However, in the third region III, when an energy density above a specific energy density Ec is irradiated, the grain size of the polycrystalline silicon thin film drastically decreases. That is, a crystallization mechanism for the silicon thin film becomes different according to the irradiated laser energy density, which will now be explained in detail.

FIGS. 2A to 2C, 3A to 3C and 4A to 4C are cross-sectional views illustrating silicon crystallization mechanisms according to laser energy densities in the graph of FIG. 1. The drawings illustrate sequential crystallization processes according to each laser energy density. A crystallization mechanism of amorphous silicon by a laser annealing is affected by various factors, such as laser irradiation conditions (i.e., laser energy density, irradiation pressure, substrate temperature or the like), physical and geometrical characteristics (i.e., absorption coefficient, thermal conductivity, mass, impurity containing degree, thickness or the like) of the amorphous silicon thin film and so on.

Figure 2A:
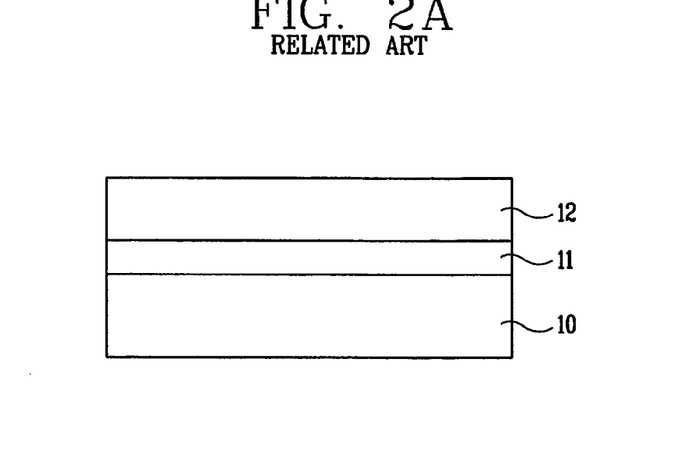
FIGS. 2 through 4 are cross-sectional views illustrating silicon crystallization mechanisms according to the laser energy densities in the graph shown in FIG. 1.
Figure 2B:
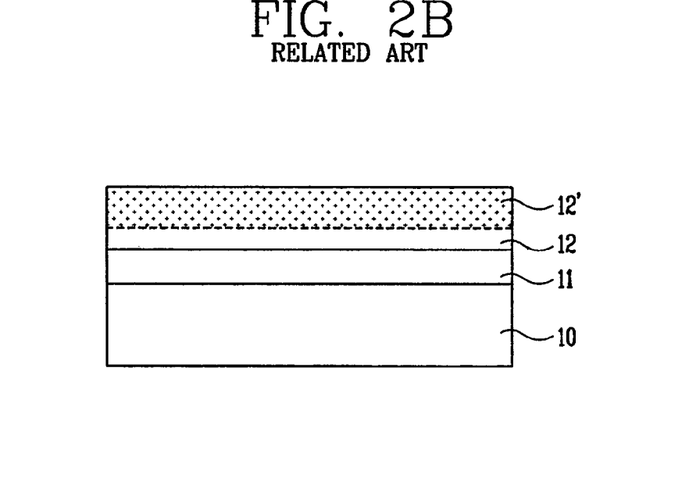
Figure 2C:
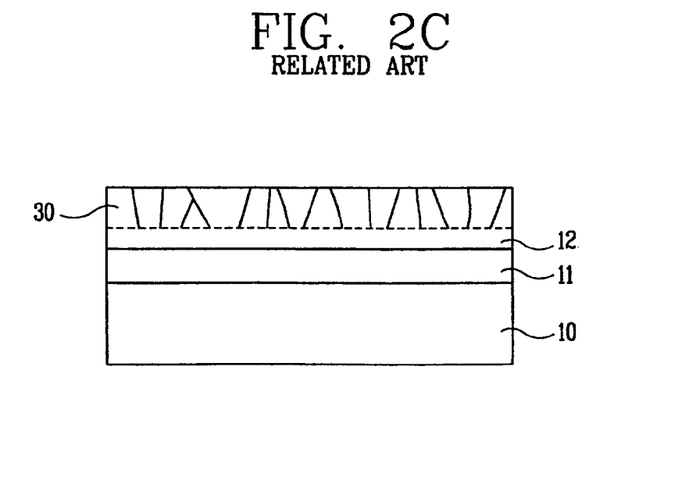

First, as illustrated in FIGS. 2A to 2C, the first region I of the graph shown in FIG. 1 is a partial melting region, and an amorphous silicon thin film 12 is crystallized only down to the dotted line. A size of a grain 30 formed at this time is about hundreds Å.

That is, when a laser beam of the first region I is irradiated onto an amorphous silicon thin film 12 on a substrate 10 on which a buffer layer 11 is formed, the amorphous silicon thin film 12 melts. At this time, strong laser energy is irradiated at a surface of the amorphous silicon thin film 12 which is directly exposed to the laser beam, and relatively weak laser energy is irradiated at a lower portion of the amorphous silicon thin film 12. As a result, the amorphous silicon thin film 12 melts only down to a certain portion so as to achieve a partial crystallization.

In the laser crystallization method, processes of a crystalline growth include primary melting in which the amorphous silicon surface layer is melted by a laser irradiation, second melting in which a lower layer is melted by a latent heat generated during the solidification of the primarily melting layer, and a crystal growth by the solidification. These crystal growth processes will now be described in detail.

An amorphous silicon thin film on which a laser beam is irradiated has a melting temperature of more than 1000° C. and primarily melts into a liquid state. Afterwards, because there occurs a great temperature difference between the primarily melting layer and the lower silicon and substrate, the primarily melting layer cools fast until solid phase nucleation and solidification are occurred. The melted layer by the laser bream irradiation remains until the solid phase nucleation and the solidification are completed. Thus, the melting state lasts for a long time when the laser energy density is high or thermal emission to the outside is low at a range where ablation does not occur. Furthermore, the primarily melting layer melts at a temperature (1000° C.) lower than the melting temperature (1400° C.) for crystalline silicon, and thus the melted layer cools and maintains a super-cooled state where the temperature is lower than the phase transition temperature. When the super-cooled state is great, namely, when the melting temperature of the thin film is low or the cooling speed is fast, a nucleation rate at the time of the solidification becomes great so as to achieve fine crystal growth.

Once the primarily melting layer cools as the solidification starts, the crystals grow in an upward direction from a crystal nucleus. As the primarily melting layer transforms its phase from a liquid state to a solid state, the latent heat is discharged. As a result, the secondary melting begins to melt the lower amorphous silicon thin film in the solid state and then the solidification occurs again. Thus, this procedure is repeated to grow crystals. The lower secondarily melting layer is more supper-cooled than the primarily melting layer, and accordingly the nucleation rate increases to make the size of the crystal smaller.

Therefore, an effective method of improving characteristics of the crystallization is to reduce the cooling speed. The cooling speed can be reduced by preventing the heat of absorbed laser energy from being emitted to the exterior, examples of which are heating the substrate, irradiating double beam, inserting a buffer insulating layer or the like.

Figure 3A:
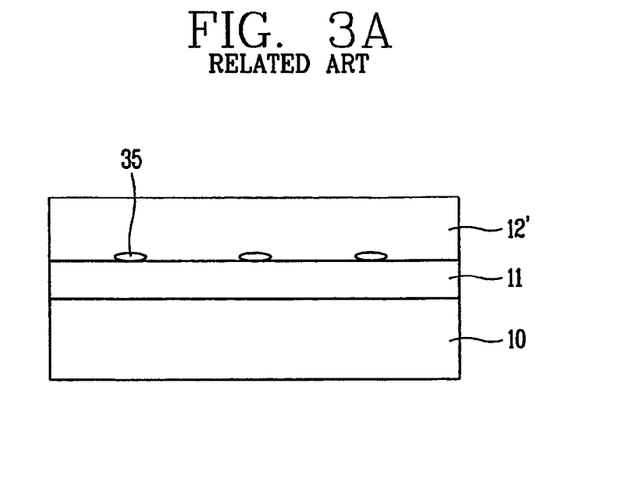
Figure 3B:
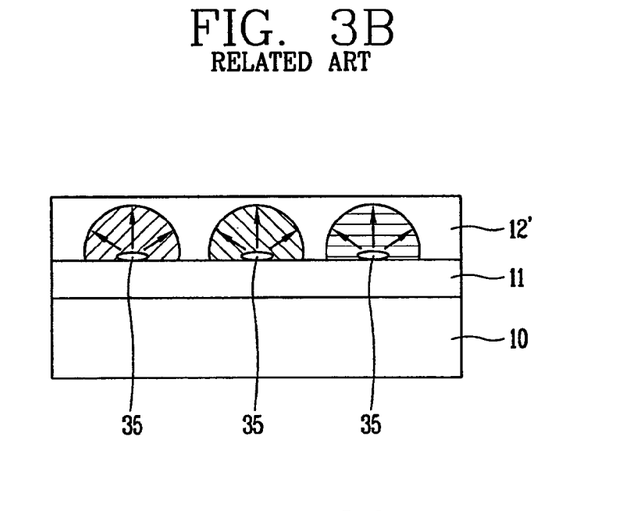
Figure 3C:
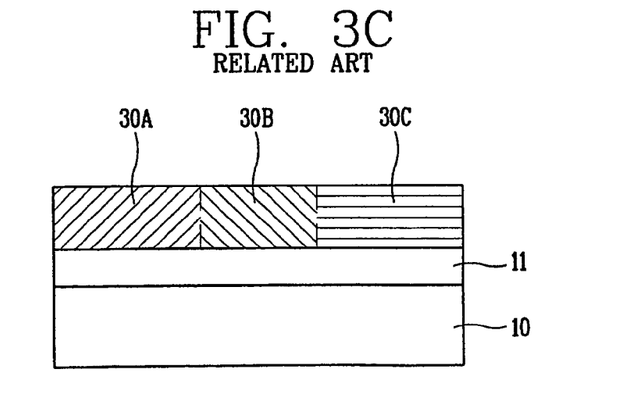

FIGS. 3A through 3C are cross-sectional views sequentially showing the silicon crystallization mechanism corresponding to the second region II of the graph shown in FIG. 1. The second region II indicates a near-completely melting region.

As can be seen in the drawings, a polycrystalline silicon thin film has relatively large grains (30A to 30C) of about 3000 to 4000 Å and is formed down to an interface of a lower buffer layer 11. That is, when a nearly complete melting energy, but not a complete melting energy, is irradiated on the amorphous silicon thin film 12, the amorphous silicon thin film 12 adjacent to the buffer layer 11 melts. At this time, solid seeds 35 that have not been melted exist at the interface between the melted silicon thin film 12' and the buffer layer 11. The seeds act as a crystallization nucleus to induce a lateral growth, thereby forming relatively large-size grains 30A to 30C.

However, because this crystallization method is possibly used only when the laser energy is such that the non-melted solid seeds 35 can remain on the interface with the buffer layer 11, the process window (process margin) is disadvantageously very limited. In addition, the solid seeds 35 are generated non-uniformly and accordingly the crystallized grains 30A to 30C of the polycrystalline silicon thin film may have different crystallization directions and different crystallization characteristics.

Figure 4A:
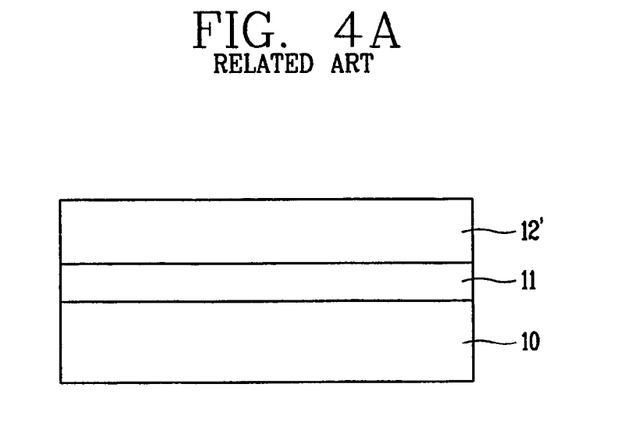
Figure 4B:
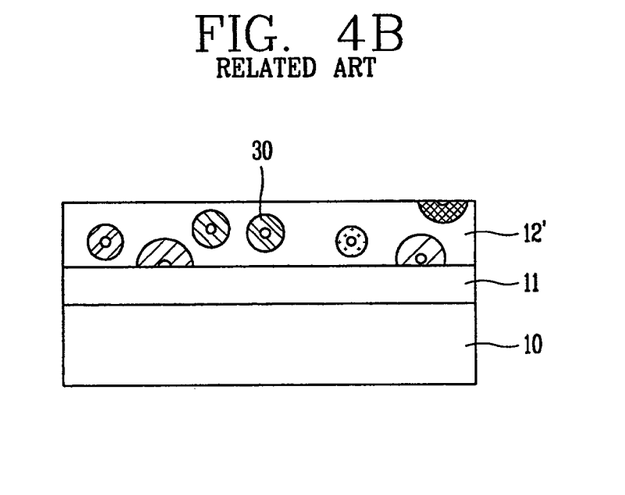
Figure 4C:
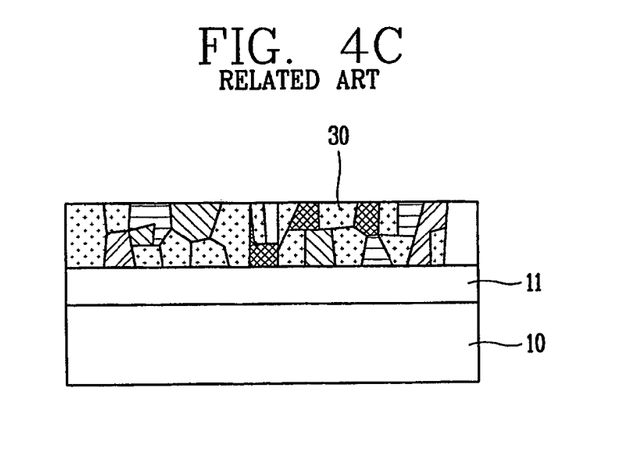

FIGS. 4A through 4C are cross-sectional views illustrating the crystallization mechanism of a completely melting region corresponding to the third region III of the graph shown in FIG. 1.

As can be seen in the drawings, very small grains 30 are irregularly formed with an energy density corresponding to the third region III. That is, when the laser energy density is more than a specific energy density level Ec, sufficient energy is applied to the amorphous silicon thin film 12 to completely melt the amorphous silicon thin film 12. As a result, solid seeds which may be grown to grains do not remain thereon. Afterwards, the silicon thin film 12' which has been melted by receiving the strong laser energy undergoes a rapid cooling process, which leads to a nucleus 30 generation and the fine grains 30.

On the other hand, an excimer laser annealing method employing a pulse type laser is generally used for the laser crystallization. However, a sequential lateral solidification (SLS) method in which the crystallization characteristics are dramatically improved by growing grains in a horizontal direction has been proposed.

The sequential lateral solidification (SLS) method utilizes the fact that the grain grows from an interface between liquid phase silicon and solid phase silicon in a perpendicular direction of the boundary surface. Here, the SLS is such a crystallization method in which the size of the silicon grain can be increased by appropriately controlling the size of the laser energy and an irradiation range of a laser beam and thus growing the grains laterally as long as a predetermined length.

Figure 5A:
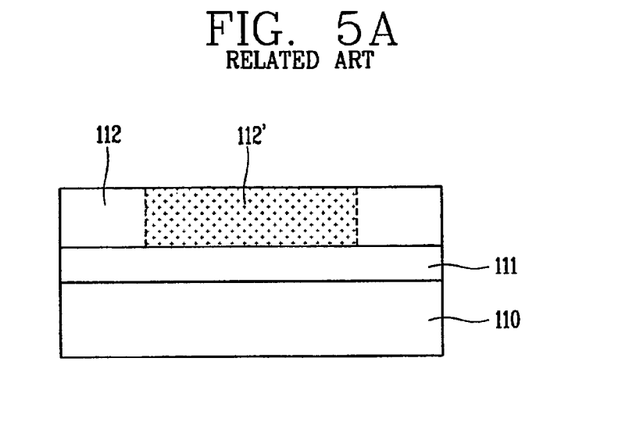
FIGS. 5A through 5C are cross-sectional views sequentially showing a crystallization procedure according to a lateral solidification.
Figure 5B:
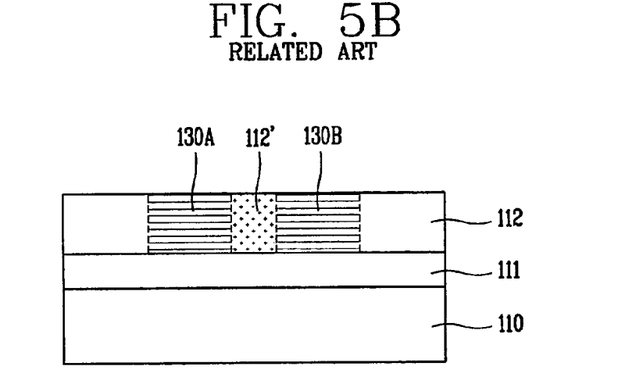
Figure 5C:
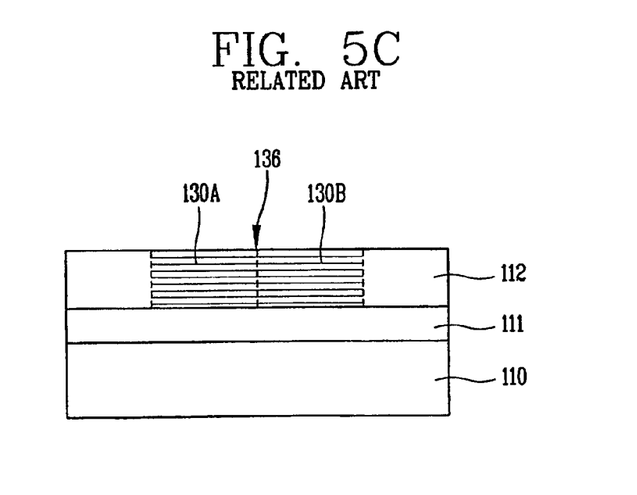

As the SLS is an example of lateral solidification, the crystallization mechanism for the lateral solidification will be now described with reference to FIGS. 5A through 5C. FIGS. 5A through 5C are cross-sectional views sequentially showing a crystallization process according to the lateral solidification.

First, as illustrated in FIG. 5A, when laser energy above an energy density at which an amorphous silicon thin film 112 completely melts (i.e., the third region III of the graph shown in FIG. 1) is irradiated onto an amorphous silicon thin film 112, the portion of the amorphous silicon thin film 112 onto which the laser energy has been irradiated completely melts. In this method, a laser-irradiated region and a laser non-irradiated region can be formed by using a patterned mask.

At this time, as illustrated in FIGS. 5B and 5C, because sufficient energy is irradiated onto the amorphous silicon thin film 112, the amorphous silicon thin film 112 completely melts. However, because the laser beam is irradiated with certain intervals, the silicon thin film 112 at the laser non-irradiated region and the solid silicon existing at the interface with the melted silicon thin film 112' work as nucleuses for crystal growth.

That is, the melted silicon thin film 112' cools from the left/right surfaces, namely, from the laser non-irradiated region, immediately after the laser beam is completely irradiated. This is because the solid phase amorphous silicon thin film 112 positioned at left/right surfaces has a higher heat conductivity than the buffer layer 111 or the glass substrate 110 at the lower portion of the silicon thin films 112 and 112'.

Therefore, the melted silicon thin film 112' first reaches a nucleation temperature at the interface between the solid phase and the liquid phase positioned at the left/right sides, rather than the central portion, thereby forming a crystal nucleus at the corresponding portion. After the crystal nucleus is formed, the grains 130A and 130B horizontally grow from a low-temperature side to a high-temperature side, namely, from the interface to the central portion. Thus, large-size grains 130A and 130B are formed by the lateral crystal growth, and the process window (process margin) is advantageously wide (not limited) because the process is performed with an energy density of the third region III.

However, the SLS method performs the crystallization by infinitesimally and repeatedly moving the mask or a stage in order to increase the size of the grains. Thus, it may take a long time to crystallize a large-size silicon film, and accordingly the whole process time may be lengthened and the process yield may become lower.

SUMMARY OF THE INVENTION

Accordingly, the present invention is directed to a laser mask and method of crystallization using the same that substantially obviates one or more of the problems due to limitations and disadvantages of the related art.

An advantage of the present invention is to provide a two-block laser mask capable of preventing or minimizing a shot mark.

Additional features and advantages of the invention will be set forth in the description which follows, and in part will be apparent from the description, or may be learned by practice of the invention. The advantages of the invention will be realized and attained by the structure particularly pointed out in the written description and claims hereof as well as the appended drawings.

To achieve these and other advantages and in accordance with the purpose of the present invention, as embodied and broadly described herein, a laser mask for crystallizing predetermined regions of a silicon thin film includes a first mask pattern in a first block; and a second mask pattern in a second block, the second mask pattern being a reverse pattern of the first mask pattern.

In another aspect of the present invention, a method of crystallization using a laser mask includes providing an array substrate in which N×M active regions are defined; positioning a laser mask having first and second blocks over the substrate, wherein the first and second blocks have first and second mask patterns, respectively, and the second mask pattern is a reverse pattern of the first mask pattern; irradiating a first laser beam onto the active regions through the first block; and irradiating a second laser beam onto the active regions through the second block.

In still another aspect of the present invention, a fabricating method for a display device includes providing a substrate having a silicon thin film; positioning a laser mask having first and second blocks over the substrate, wherein the first and second blocks have first and second mask patterns, respectively, and the second mask pattern is a reverse pattern of the first mask pattern; irradiating a first laser beam onto the silicon thin film through the first block; and irradiating a second laser beam onto the silicon thin film through the second block.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

Figure 6:
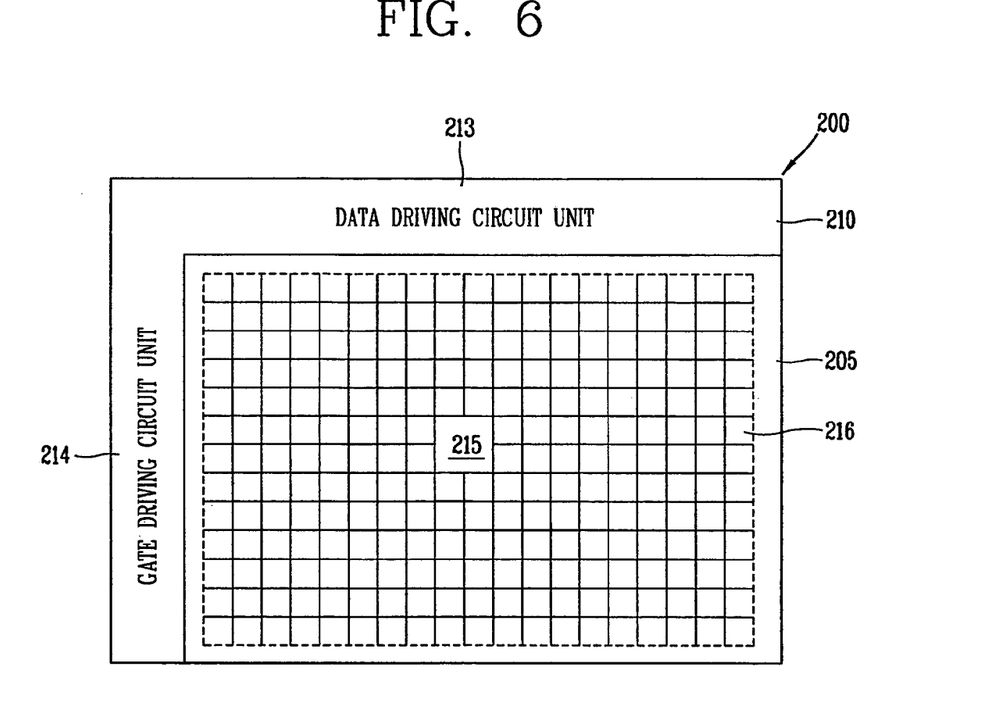
FIG. 6 is a schematic plan view illustrating a liquid crystal display panel according to the present invention.

FIG. 6 is a schematic plan view illustrating a liquid crystal display panel according to the present invention, in which a driving circuit is integrated with an array substrate thereof.

Referring to FIG. 6, a driving circuit-integrated liquid crystal display panel 200 includes an array substrate 210, a color filter substrate 205 and a liquid crystal layer (not shown) formed between the array substrate 210 and the color filter substrate 205. The array substrate 210 further includes a pixel unit 215, which is an image display region where unit pixels 216 are arranged in a matrix configuration, a gate driving circuit unit 214 and a data driving circuit unit 213 located at the outside of the pixel unit 215.

Although not shown in the drawing, the pixel unit 215 of the array substrate 210 includes a plurality of gate lines and data lines crossing each other to define a plurality of unit pixels 216 on the substrate 210, thin film transistors, which are switching devices formed near each crossing of the gate lines and the data lines, and pixel electrodes formed in the unit pixel 216 regions. As a switching device for applying and blocking a signal voltage to/from the pixel electrode, the thin film transistor is a field effect transistor (FET) for controlling a flow of current by an electric field.

Regarding the driving circuit units 213 and 214 of the array substrate 210, the data driving circuit unit 213 is positioned at the longer side of the array substrate 210 which is protruded compared with the color filter substrate 205, and the gate driving circuit part 214 is positioned at the shorter side of the array substrate 210. The gate driving circuit unit 214 and the data driving circuit unit 213 includes a thin film transistor having a CMOS (Complementary Metal Oxide Semiconductor) structure which is an inverter for suitably outputting an inputted signal.

The gate driving circuit unit 214 and the data driving circuit unit 213, which are devices for supplying a scan signal and a data signal to the pixel electrode through the gate line and the data line, respectively, are connected to an external signal input terminal (not shown) so as to control an external signal transmitted through the external signal input terminal and output it to the pixel electrode.

Although not shown, a color filter for implementing color and a common electrode, which is a counter electrode of the pixel electrode formed on the array substrate 210, are formed on the image display region 215 of the color filter substrate 205. A spacer (not shown) between the array substrate 210 and the color filter substrate 205 is formed to provide a uniform cell gap. The array substrate 210 and the color filter substrate 205 are attached by a seal pattern (not shown) formed at an outer edge of the image display region 215, to form the liquid crystal display panel 200.

The thin film transistors are formed at each unit pixel 216 of the image display region 215 of the array substrate 210, that is, near each crossing of the gate lines and the data lines as well as predetermined regions of the driving circuit units including the data driving circuit unit 213 and the gate driving circuit unit 214. According to the present invention, crystallization is selectively carried out by a laser crystallization method only at active regions where active layers of the thin film transistors are positioned, thereby shortening a process time for the crystallization. This process will now be described in detail.

Figure 7:
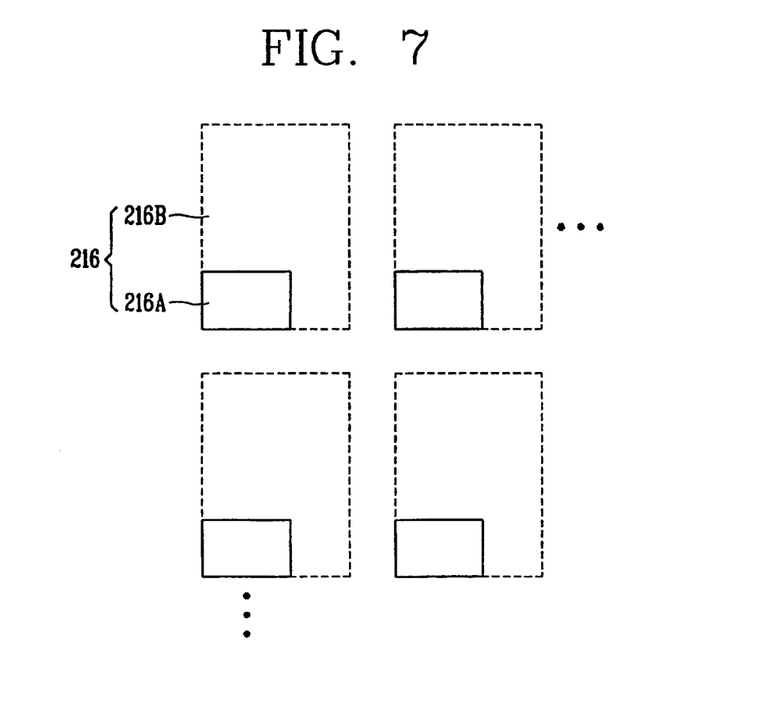
FIG. 7 is a schematic exemplary view illustrating parts of an image display region on an array substrate of the liquid crystal display panel shown in FIG. 6.

FIG. 7 is an exemplary view schematically illustrating parts of an image display region in the array substrate of the liquid crystal display panel shown in FIG. 6. For convenience, four unit pixels arranged in a 2×2 matrix configuration are illustrated in FIG. 7.

Referring to FIG. 7, each unit pixel 216 of the image display region can be divided into two regions. An active region 216A (first region) where an active layer of a switching device is formed needs a crystallization process, and a pixel region 216B (second region) where is a region excluding the first region 216A from one unit pixel 216 does not need the crystallization process.

In the drawing, the active region 216A is indicated in a rectangular shape. However, the present invention is not limited thereto and the active region 216A can have various shapes according to designing conditions of an active pattern. Here, it is assumed that an active pattern formed by patterning an active layer is positioned within the active region 216A.

Thus, according to the principles of the present invention, a crystallization process time can be shortened by selectively crystallizing only the active regions while fabricating the array substrate. In the active regions, a region where the active pattern is positioned is substantially free of laser shot mark, and a polycrystalline silicon thin film of the active pattern has uniform and excellent electrical characteristics, when it is formed by a sequential lateral solidification.

The laser shot mark is a problem that occurs in all laser crystallization methods in which a laser beam overlaps. According to the present invention, this shot mark problem can be prevented or minimized by using a periodicity of a pattern of a laser mask and making an boundary region between blocks of the laser mask a blocking region (or a non-transmitting region). This will now be described in more detail.

Figure 8A:
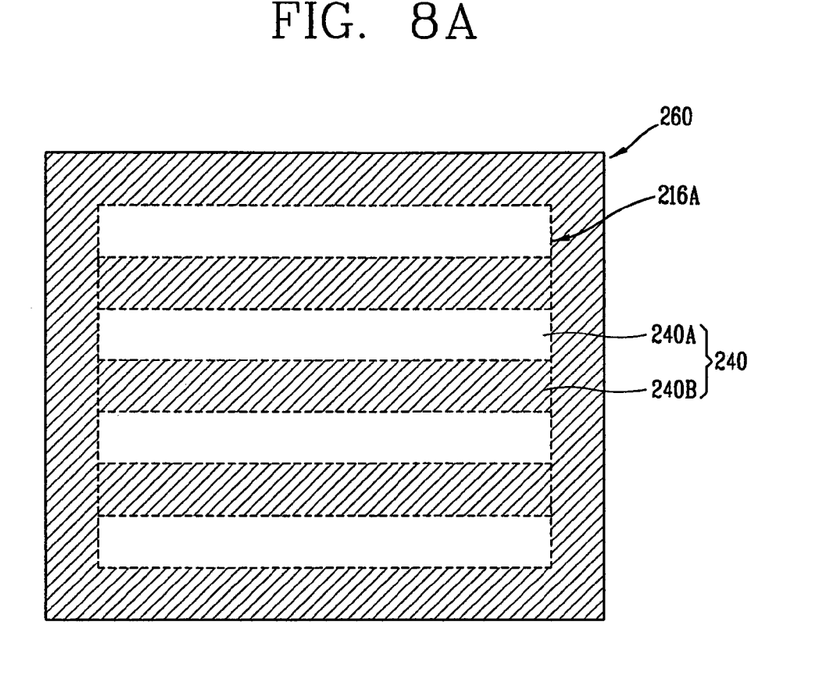
FIGS. 8A and 8B are exemplary views illustrating two blocks of a laser mask corresponding to an active region, which is used for a sequential lateral solidification according to the present invention.
Figure 8B:
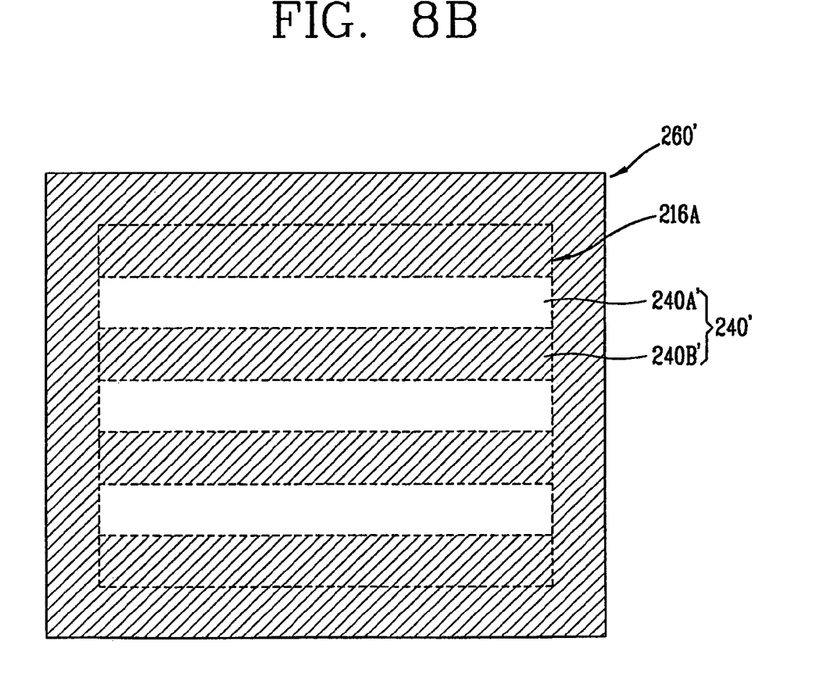

FIGS. 8A and 8B are exemplary views illustrating two blocks of a laser mask corresponding to an active region, which is used for a sequential lateral solidification according to the present invention. As illustrated, each block has a pattern and an active region can be entirely crystallized by irradiating a laser beam twice through the two blocks.

FIG. 8A illustrates a first block 260 of a laser mask. As shown in FIG. 8A, the first block includes a plurality of first transmitting regions 240A having a slit shape for transmitting beams, and a plurality of first blocking regions 240B of a slit shape for blocking beams. The first transmitting regions 240A correspond to an active region 216A. As illustrated in FIG. 8B, a second block 260' of the laser mask includes a plurality of second transmitting regions 240A' of a slit shape for transmitting beams, and a plurality of second blocking regions 240B' of a slit shape for blocking beams. The second transmitting regions 240A' correspond to the active region 216A.

The second transmitting regions 240A' are positioned at an area corresponding to the first blocking regions 240B of the first block, and the second blocking regions 240B' are positioned at an area corresponding to the first transmitting regions 240A of the first block. Thus, the first transmitting regions 240A of the first block and the second transmitting regions 240A' of the second block cover the entire area of the active region 216A. Accordingly, the entire area of the active region 216A can be crystallized by irradiating a laser beam twice through the two blocks 260 and 260' of the laser mask ("two-shot crystallization").

In this example, although the transmitting regions 240A and 240A' and the blocking regions 240B and 240B' are formed to have a slit shape in a horizontal direction, the present invention is not limited thereto and they may be formed to have a variety of shapes in all directions. In other words, a laser mask can be configured in various ways in accordance with the present invention, so long as the second block has a reverse pattern of the first block so that the entire area of an active region 216A can be crystallized by the two-shot crystallization.

Figure 9A:
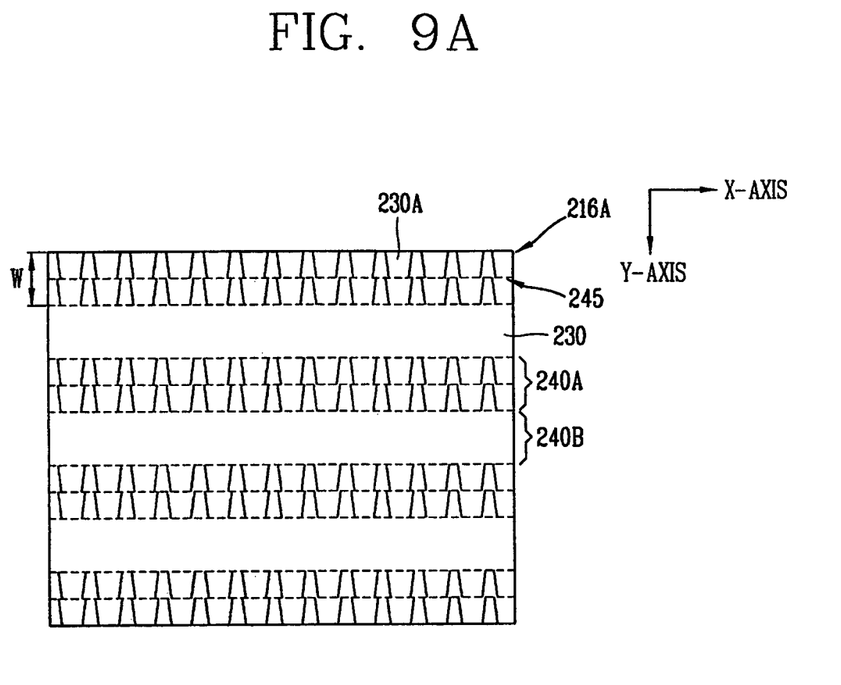
FIGS. 9A and 9B are exemplary views illustrating processes for crystallizing a silicon thin film using a laser masks illustrated in FIGS. 8A and 8B.
Figure 9B:
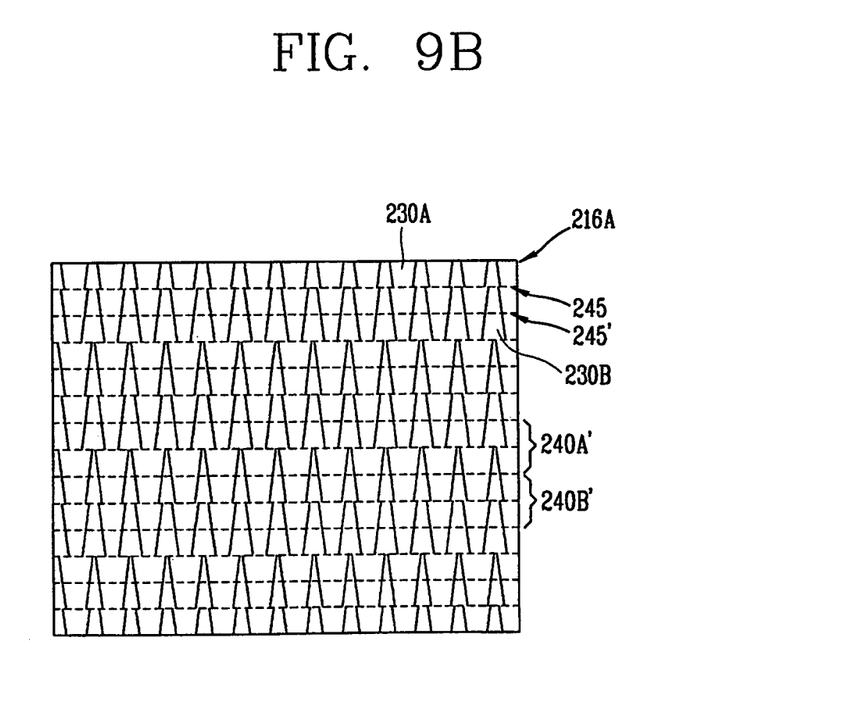

FIGS. 9A and 9B are exemplary views illustrating processes for crystallizing a silicon thin film using a laser masks illustrated in FIGS. 8A and 8B. A silicon thin film formed by the crystallization process using the two-block laser mask is proven to have no shot mark.

Referring to FIG. 9A, when an active region 216A formed of an amorphous silicon thin film 230 is first irradiated by a laser beam through the first block 260 of the laser mask shown in FIG. 8A (i.e., through the first transmitting regions 240A of the mask pattern 240), the amorphous silicon thin film becomes a polycrystalline silicon thin film 230A, which is a first crystal having grains grown toward a vertical direction (i.e., an Y-axis direction as shown in the drawing). During the crystallization, the amorphous silicon thin film 230 positioned at an interface where the laser beam is not irradiated works a nucleus.

The region crystallized by the first crystallization corresponds to the first transmitting regions 240A of the laser mask. When a width W of the first transmitting regions 240A is configured considering the maximum size of the grain to grow by the sequential lateral solidification, the first crystal can have a large-size grain with only one grain boundary 245.

After completing the first crystallization, a second crystallization proceeds by irradiating a laser beam through the second block 260' of the laser mask shown in FIG. 8B in order to crystallize the residual amorphous silicon thin film. The second crystallization is carried out by irradiating a laser beam without moving the laser mask or a stage on which a substrate deposited with the amorphous silicon film is positioned. As shown in FIG. 9B, grains grow toward the second transmitting region 240A' of the mask pattern 240' of the second block by using a pattern of the silicon thin film 230A crystallized by the first crystallization as a seed. As a result, a second crystal 230B of polycrystalline silicon is formed, thereby crystallizing the entire area of the active region 216A.

The silicon thin film crystallized by the second crystallization (the second crystal 230B) can have grains which grow from the grain boundary 245 formed by the first crystallization to a grain boundary 245' formed by the second crystallization. Here, when a width W of the second transmitting region 240A' is equal to that of the first transmitting region 240A, the grains become as large as the width W.

Thus, when the two-shot crystallization is carried out by employing the two-block laser mask, the active region 216A of the substrate can be crystallized without an X-overlap or Y-overlap, that is, without a shot mark.

The two blocks described above can be applied to a laser mask in a variety of ways. For instance, an embodiment in which the two blocks are applied to a laser mask will now be explained.

Figure 10:
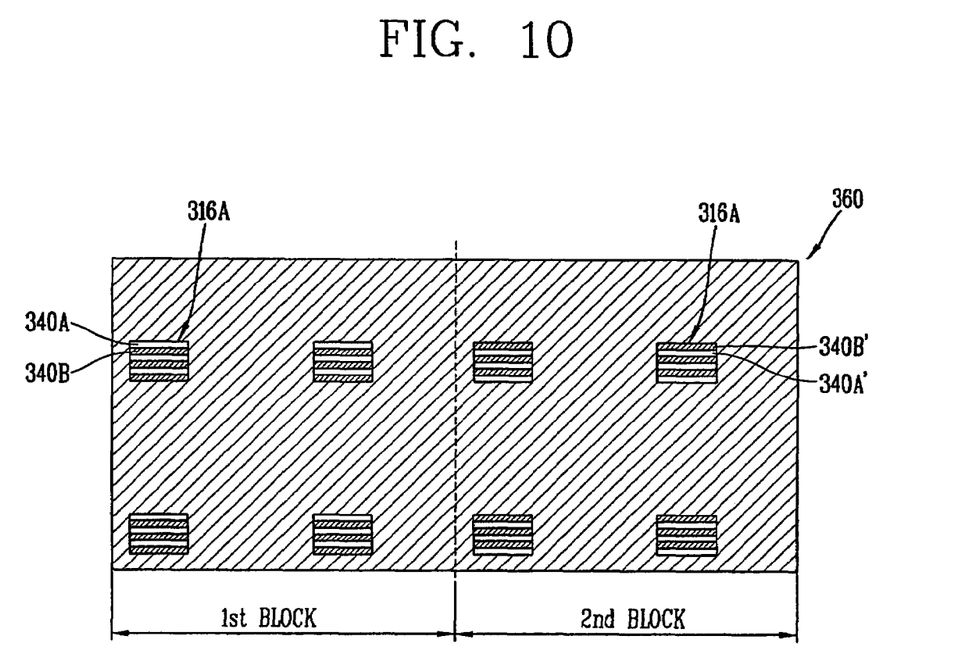
FIG. 10 is an exemplary view illustrating a part of a two-block laser mask in accordance with a first embodiment of the present invention.

FIG. 10 is an exemplary view showing a part of a two-block laser mask in accordance with a first embodiment of the present invention, which illustrates a configuration of a laser mask for crystallizing active regions 316A of 2×2 unit pixels by a two-shot crystallization. Although this embodiment only illustrates a laser mask for crystallizing the active regions 316A of the 2×2 unit pixels, the present invention is not limited thereto and a laser mask can be configured to crystallize active regions of N×M unit pixels according to a size of a liquid crystal display panel and conditions of laser optical systems.

Referring to FIG. 10, a laser mask 360 includes two blocks. A first block has a first mask pattern (i.e., a plurality of first transmitting regions 340A and first blocking regions 340B) for first crystallizing the 2×2 active regions 316A, while a second block has a mask pattern (i.e., a plurality of second transmitting regions 340A' and second blocking regions 340B') for second crystallizing residual regions.

At this time, the first transmitting regions 340A of the first block correspond to the second blocking regions 340B' of the second block, and the first blocking regions 340B of the first block correspond to the second transmitting regions 340A' of the second block, so as to crystallize the entire active regions 316A by a two-shot crystallization.

During a two-shot crystallization, a second crystallization can be carried out by moving the laser mask 360 or a substrate (not shown) in a horizontal direction by a block distance and irradiating a laser beam through the second block after completing a first crystallization. Furthermore, although not shown, moving the laser mask or the substrate in a desired direction can be repeated in order to crystallize the N×M active regions 316A of a liquid crystal display panel according to the present invention.

In the mask patterns, the transmitting regions 340A and 340A' and the blocking regions 340B and 340B' have a slit shape in a horizontal direction, and accordingly, grains grow in a vertical direction during the crystallization. As a result, the laser mask 360 in the first embodiment is suitable for crystallizing channels of thin film transistors aligned in a vertical direction, as the grains in the channels grow in a vertical direction, which can increase the mobility of the thin film transistors. When the channels are desired to be formed in a horizontal direction, the following embodiment is preferable in which mask patterns in a laser mask are aligned in a vertical direction.

Figure 11:
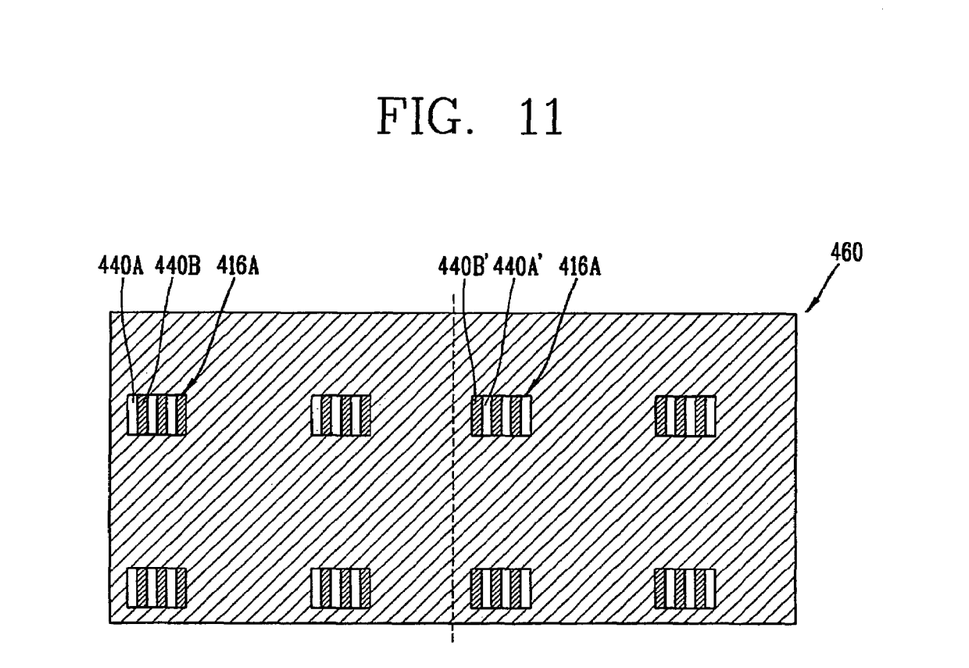
FIG. 11 is an exemplary view illustrating a part of a two-block laser mask in accordance with a second embodiment of the present invention.

FIG. 11 is an exemplary view illustrating a part of a two-block laser mask in accordance with a second embodiment of the present invention, which has the same configuration as the laser mask shown in the first embodiment of FIG. 10, except that the mask patterns are formed in a different direction.

As illustrated in FIG. 11, a first mask pattern (i.e., a plurality of first transmitting regions 440A and first blocking regions 440B) for first crystallizing 2×2 active regions 416A is formed in a first block, while a second mask pattern (i.e., a plurality of transmitting regions 440A' and second blocking regions 440B') for second crystallizing residual regions is formed in a second block.

The first transmitting regions 440A of the first block correspond to the second blocking regions 440B' of the second block and the first blocking regions 440B of the first block correspond to the second transmitting region 440A' of the second block. Unlike the mask patterns of the first embodiment, both the blocking regions 440A and 440A' and the transmitting regions 440B and 440B' have a slit shape in a vertical direction.

Next, a fabricating method for a liquid crystal display panel using a polycrystalline silicon thin film formed according to the present invention will now be explained.

Figure 12:
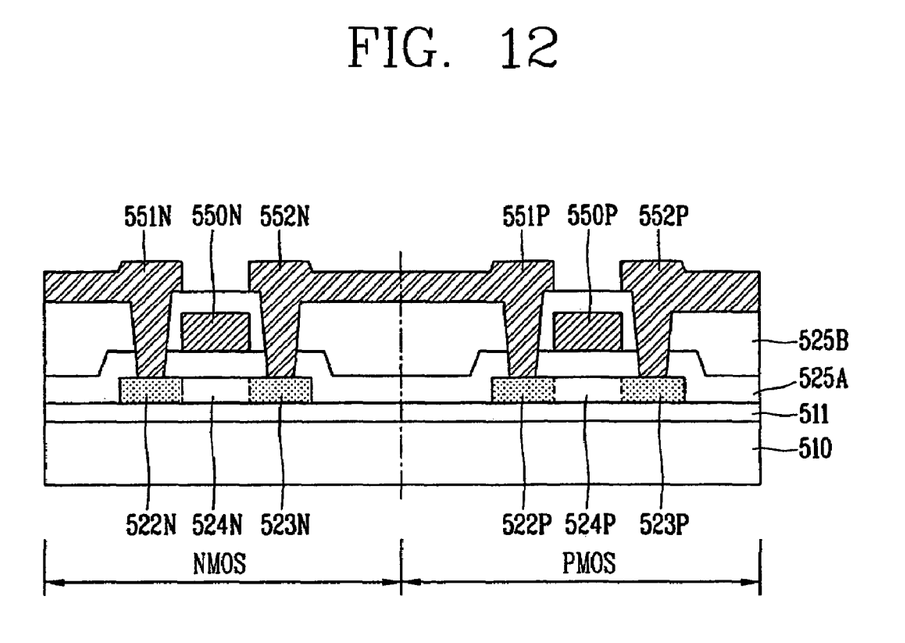
FIG. 12 is an exemplary view illustrating a liquid crystal display device fabricated by using the silicon thin film crystallized by a crystallization method according to the present invention.

FIG. 12 is an exemplary view illustrating a liquid crystal display panel fabricated by using the silicon thin film crystallized by a crystallization method according to the present invention.

Here, either an N-type or a P-type thin film transistor is available for a thin film transistor at a pixel unit. For a driving circuit unit, a CMOS structure having both N-type and P-type thin film transistors is typically used. However, for reference, an example of the CMOS structure is illustrated in the drawing.

Hereinafter, a method for fabricating a liquid crystal display device will be described.

First, a buffer layer 511 made of a silicon oxide film $SiO_2$ is formed on a substrate 510 made of a transparent insulating material such as glass.

Next, active layers 524N and 524P made of polycrystalline silicon are formed on the substrate 510 having the buffer layer 511 thereon. The active layers 524N and 524P are formed of a polycrystalline silicon thin film having uniform crystallization characteristics without a shot mark by depositing an amorphous silicon thin film on the substrate and then crystallizing only active regions by a two-shot crystallization method using a two-block laser mask according to the present invention. Afterwards, the polycrystalline silicon thin film crystallized is patterned through a photolithography process to form the active patterns 524N and 524P on NMOS and PMOS regions.

Afterwards, a gate insulating film 525A is deposited on the substrate 510 having the active layers 524N and 524P formed thereat.

Next, gate electrodes 550N and 550P made of molybdenum (Mo), aluminum (Al) or an aluminum allow are formed on predetermined regions (i.e., channel regions of the active layers 524N and 524P) of the substrate 510 having the gate insulating film 5225A deposited thereto. The gate electrodes 550N and 550P are formed by depositing a gate metal on the entire surface of the substrate 510 having the gate insulating film 525A formed thereto and then by using a photolithography process.

Next, a N-type thin film transistor (formed by implanting n+ impurity ions in predetermined regions (source/drain regions 522N and 523N) of the active layer 524N) and a P-type thin film transistor (formed by implanting p+ impurity ions in predetermined regions (source/drain regions 522P and 523P) of the active layer 524P) are formed by sequentially performing a N-doping process and a P-doping process.

Next, an interlayer insulating film 525B is deposited on the entire surface of the substrate 510, and then contact holes (not shown) exposing parts of the source/drain regions are formed using a photolithography process.

Afterwards, source/drain electrodes 551N, 551P, 552N, and 522P electrically connected to the source/drain regions 522N, 522P, 523N, and 523P through the contact holes are formed, thereby completing a CMOS liquid crystal display device as shown in FIG. 12.

Although this embodiment describes a method for fabricating a liquid crystal display device in accordance with the present invention, it should be appreciated that the present invention is not limited thereto, and that the principles of the present invention can be applicable to other devices such as an organic EL or the like.

It will be apparent to those skilled in the art that various modifications and variations can be made in the above-discussed display device and the driving method thereof without departing from the spirit or scope of the invention. Thus, it is intended that the present invention cover the modifications and variations of this invention provided they come within the scope of the appended claims and their equivalents.

What is claimed is:

1. A laser mask for crystallizing predetermined regions of a silicon thin film, comprising:
    a first mask pattern in a first block;
    a second mask pattern in a second block, the second mask pattern being a reverse pattern of the first mask pattern; and
    a boundary region in the vicinity of the first and second blocks, wherein the boundary region corresponds to the outside of the active region to eliminate a shot mark.

2. The laser mask of claim 1, wherein the first mask pattern includes a plurality of first transmitting regions and a plurality of first blocking regions excluding the first transmitting regions, and the second mask pattern includes a plurality of second blocking regions corresponding to the first transmitting regions and a plurality of second transmitting regions corresponding to the first blocking regions.

3. The laser mask of claim 2, wherein the first transmitting regions and the second blocking regions have the same shape, and the first blocking regions and the second transmitting regions have the same shape.

4. The laser mask of claim 2, wherein the transmitting regions and the blocking regions have a slit shape in a horizontal direction.

5. The laser mask of claim 2, wherein the transmitting regions and the blocking regions have a slit shape in a vertical direction.

6. The laser mask of claim 1, wherein the predetermined regions are active regions of unit pixels having active patterns formed therein.

* * * * *